US 6,660,447 B2

(12) United States Patent
Hatakeyama et al.

(10) Patent No.: US 6,660,447 B2
(45) Date of Patent: Dec. 9, 2003

(54) POLYMERS, RESIST COMPOSITIONS AND PATTERNING PROCESS

(75) Inventors: Jun Hatakeyama, Kubiki-mura (JP); Yuji Harada, Kubiki-mura (JP); Jun Watanabe, Kubiki-mura (JP); Masaru Sasago, Osaka (JP); Masayuki Endo, Osaka (JP); Shinji Kishimura, Itami (JP)

(73) Assignees: Shin-Etsu Chemical Co., Ltd., Tokyo (JP); Matsushita Electric Industrial Co., Ltd., Osaka (JP)

( * ) Notice: Subject to any disclaimer, the term of this patent is extended or adjusted under 35 U.S.C. 154(b) by 50 days.

(21) Appl. No.: 09/947,767

(22) Filed: Sep. 7, 2001

(65) Prior Publication Data

US 2002/0051937 A1 May 2, 2002

(30) Foreign Application Priority Data

Sep. 7, 2000 (JP) ........................................ 2000-271189

(51) Int. Cl.⁷ ............................. G03F 7/004; C08F 12/02
(52) U.S. Cl. .................... 430/270.1; 430/326; 526/346; 526/341; 526/242
(58) Field of Search ............................... 430/270.1, 326; 526/313, 242, 297, 341, 346

(56) References Cited

U.S. PATENT DOCUMENTS

2002/0160297 A1 * 10/2002 Fedynyshyn et al.
2002/0164538 A1 * 11/2002 Allen et al.

FOREIGN PATENT DOCUMENTS

| JP | A 63-27829 | 2/1988 |
| JP | B 2-27660 | 6/1990 |
| JP | A 9-73173 | 3/1997 |
| JP | A 9-230595 | 9/1997 |
| JP | A 10-10739 | 1/1998 |
| WO | WO 97/33198 | 9/1997 |

* cited by examiner

Primary Examiner—Rosemary Ashton
(74) Attorney, Agent, or Firm—Millen, White, Zelano, Branigan, P.C.

(57) ABSTRACT

A polymer having fluorinated vinyl phenol units copolymerized with acrylonitrile units has high transmittance to VUV radiation. A resist composition using the polymer as a base resin has high sensitivity and resolution to high-energy radiation and good plasma etching resistance and is suited for lithographic microprocessing.

24 Claims, No Drawings

POLYMERS, RESIST COMPOSITIONS AND PATTERNING PROCESS

This invention relates to polymers useful as the base resin in chemical amplification resist compositions suited for microfabrication. It also relates to chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation, promising a possibility of commercial manufacture of devices on 0.10 micron rule. To the demand for a resist material with a higher resolution and sensitivity, acid-catalyzed chemical amplification positive working resist materials are effective as disclosed in U.S. Pat. Nos. 4,491,628 and 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated. With a wavelength reduction from KrF to ArF laser (193 nm), it is expected to enable miniaturization of the design rule to 0.13 μm or less. Since conventionally used novolac resins and poly(vinyl phenol) resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ excimer laser (157 nm) which is expected to enable further miniaturization to 0.10 μm or less, more difficulty arises in insuring transparency because it was found that acrylic resins are not transmissive to light at all and those cycloolefin resins having carbonyl bonds have strong absorption. It was also found that poly(vinyl phenol) is somewhat improved in transmittance near 160 nm, but far below the practical level. It was found that reducing carbonyl and carbon-to-carbon double bonds is essential for insuring a transmittance.

Under the circumstances, there is a need for a resist composition which performs well upon exposure to radiation having a wavelength below 180 nm.

SUMMARY OF THE INVENTION

An object of the invention is to provide a novel polymer having a high transmittance to vacuum ultraviolet radiation below 300 nm, especially $F_2$ excimer laser beam (157 nm), $Kr_2$ excimer laser beam (146 nm), KrAr excimer laser beam (134 nm) and $Ar_2$ excimer laser beam (121 nm), and useful as the base resin in a chemical amplification resist composition. Another object is to provide a chemical amplification resist composition comprising the polymer, and a patterning process using the same.

It has been found that using as the base resin a polymer having fluorinated vinyl phenol units copolymerized with acrylonitrile units, a resist material featuring high transparency and etching resistance is obtained.

The invention is predicated on the finding below. Phenolic polymers exhibit superior etching resistance and alkali solubility to acrylic polymers. Among others, halogenated, especially fluorinated phenolic polymers have significant transmittance-improving effects, affording a practically acceptable transmittance. Polyacrylonitrile is relatively transparent to wavelengths in the $F_2$ region and has higher etching resistance than acrylic polymers. Then copolymerization of fluorinated hydroxystyrene with polyacrylonitrile can improve transparency without sacrificing etching resistance.

In one aspect, the invention provides a polymer comprising recurring units of the following general formula (1).

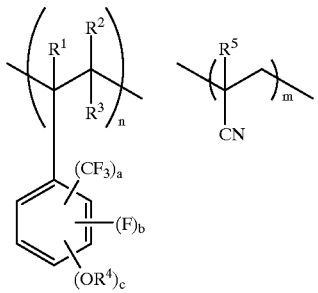

(1)

Herein $R^1$, $R^2$, $R^3$ and $R^5$ each are independently hydrogen, fluorine, or a straight, branched or cyclic alkyl or fluorinated alkyl group of 1 to 20 carbon atoms, $R^4$ is an acid labile group, letters a, b and c are numbers satisfying $0 \leq a < 5$, $0 \leq b < 5$, $0 < a+b < 5$ and $0 < c < 5$, and m and n are positive numbers.

In another aspect, the invention provides a resist composition comprising the polymer. In a preferred embodiment, the invention provides a chemically amplified, positive resist composition comprising (A) the polymer, (B) an organic solvent, and (C) a photoacid generator. In further preferred embodiments, the resist composition further includes (D) a basic compound and/or (E) a dissolution inhibitor.

In a further aspect, the invention provides a process for forming a resist pattern comprising the steps of applying the resist composition onto a substrate to form a coating; heat treating the coating and then exposing it to high-energy radiation having a wavelength of up to 300 nm or electron beam through a photo mask; and optionally heat treating the exposed coating and developing it with a developer.

DESCRIPTION OF THE PREFERRED EMBODIMENT

Polymer

According to the invention, the polymer or high molecular weight compound is defined as comprising recurring units of the following general formula (1).

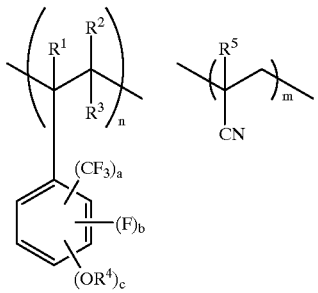

(1)

Herein $R^1$, $R^2$, $R^3$ and $R^5$ each are independently hydrogen, fluorine, or a straight, branched or cyclic alkyl or fluorinated alkyl group of 1 to 20 carbon atoms. $R^4$ is an acid labile group.

The straight, branched or cyclic alkyl groups represented by $R^1$, $R^2$, $R^3$ and $R^5$ are those of 1 to 20 carbon atoms, preferably 1 to 12 carbon atoms, and more preferably 1 to 10 carbon atoms, including methyl, ethyl, propyl, isopropyl, n-butyl, sec-butyl, tert-butyl, cyclopentyl, cyclohexyl, 2-ethylhexyl, and n-octyl. The fluorinated alkyl groups correspond to the foregoing alkyl groups in which some or all of the hydrogen atoms are replaced by fluorine atoms and include, for example, trifluoromethyl, 2,2,2-trifluoroethyl, 3,3,3-trifluoropropyl, and 1,1,2,2,3,3,3-heptafluoropropyl.

The acid labile group represented by $R^4$ is selected from a variety of such groups, preferably from among the groups of the following formulas (2) and (3), tertiary alkyl groups with 4 to 40 carbon atoms of the following formula (4), trialkylsilyl groups whose alkyl groups each have 1 to 6 carbon atoms, and oxoalkyl groups of 4 to 20 carbon atoms.

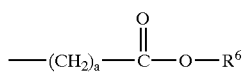

(2)

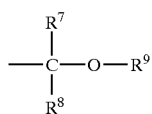

(3)

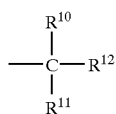

(4)

In formula (2), $R^6$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (4). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxoran-4-yl. Letter "a" is an integer of 0 to 6.

In formula (3), $R^7$ and $R^8$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^9$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

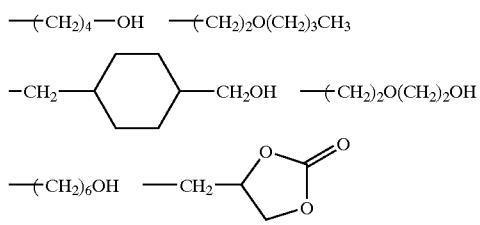

A pair of $R^7$ and $R^8$, a pair of $R^7$ and $R^9$, or a pair of $R^8$ and $R^9$, taken together, may form a ring. Each of $R^7$, $R^8$ and $R^9$ is a straight or branched alkylene group of 1 to 18 carbon atoms, preferably 1 to 10 carbon atoms, when they form a ring.

Illustrative examples of the acid labile groups of formula (2) include tert-butoxycarbonyl, tert-butoxycarbonylmethyl, tert-amyloxycarbonyl, tert-amyloxycarbonyl-methyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Of the acid labile groups of formula (3), illustrative examples of the straight or branched groups are given below.

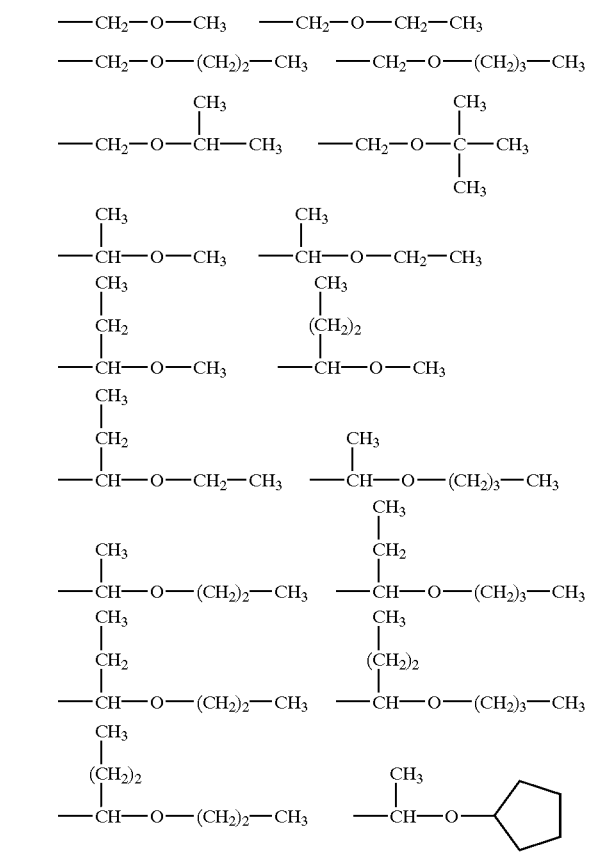

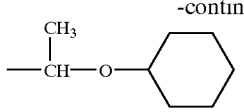
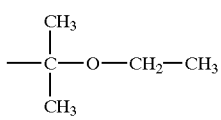

Of the acid labile groups of formula (3), illustrative examples of the cyclic groups include tetrahydrofuran-2-yl, 2-methyltetrahydrofuran-2-yl, tetrahydropyran-2-yl and 2-methyltetrahydropyran-2-yl. Preferred among the groups of formula (3) are ethoxyethyl, butoxyethyl and ethoxypropyl.

In formula (4), $R^{10}$, $R^{11}$ and $R^{12}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{10}$ and $R^{11}$, a pair of $R^{10}$ and $R^{12}$, or a pair of $R^{11}$ and $R^{12}$, taken together, may form a ring. Each of $R^{10}$, $R^{11}$ and $R^{12}$ is a straight or branched alkylene group of 3 to 20 carbon atoms, preferably 4 to 16 carbon atoms, when they form a ring.

Examples of the tertiary alkyl group represented by formula (4) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (4-1) through (4-16).

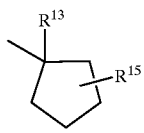
(4)-1

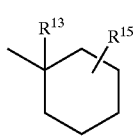
(4)-2

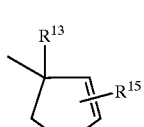
(4)-3

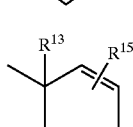
(4)-4

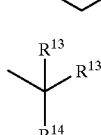
(4)-5

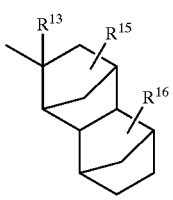
(4)-6

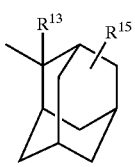
(4)-7

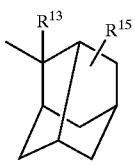
(4)-8

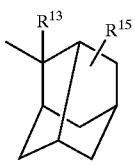
(4)-9

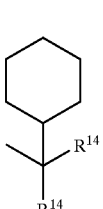
(4)-10

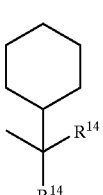
(4)-11

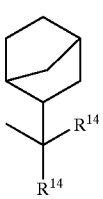
(4)-12

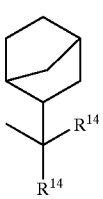
(4)-13

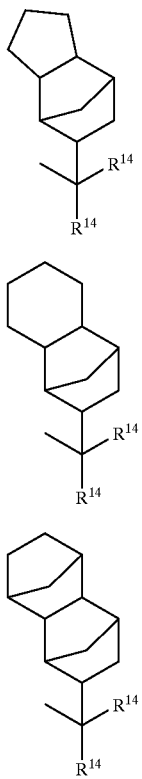

(4)-14

(4)-15

(4)-16

Herein, $R^{13}$ and $R^{14}$ each are a straight, branched or cyclic alkyl group of 1 to 6 carbon atoms, for example, methyl, ethyl, propyl, isopropyl, n-butyl, sec-butyl, n-pentyl, n-hexyl, cyclopropyl, cyclopropylmethyl or cyclohexyl. $R^{15}$ is hydrogen, a monovalent C1–6 hydrocarbon group which may contain a hetero atom or a monovalent C1–6 hydrocarbon group which may be separated by a hetero atom, with the hydrocarbon being typically alkyl. The hetero atom is an oxygen, sulfur or nitrogen atom, which is contained or intervenes in the form of —OH, —OR, —O—, —S—, —S(=O)—, —NH$_2$, —NHR, —NR$_2$, —NH—, or —NR— wherein R is an alkyl group of 1 to 20 carbon atoms, and especially 1 to 16 carbon atoms.

$R^{16}$ is hydrogen or an alkyl, hydroxyalkyl, alkoxy or alkoxyalkyl group of 1 to 20 carbon atoms, especially 1 to 16 carbon atoms, which may be straight, branched or cyclic. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Of the acid labile group represented by $R^4$, the trialkylsilyl groups whose alkyl groups each have 1 to 6 carbon atoms include trimethylsilyl, triethylsilyl, and tert-butyldimethylsilyl.

The oxoalkyl groups of 4 to 20 carbon atoms include 3-oxocyclohexyl and groups of the following formulae.

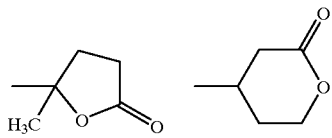

Alternatively, the acid labile group represented by $R^4$ may be a crosslinking group of the following general formula (5a) or (5b). In this embodiment, the polymer is crosslinked between molecules or within a molecule with the crosslinking groups.

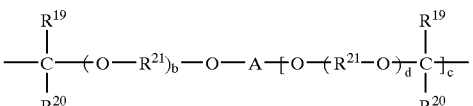

(5a)

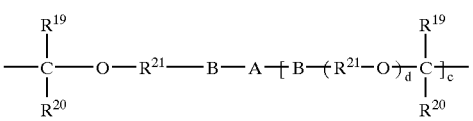

(5b)

Herein, $R^{19}$ and $R^{20}$ each are hydrogen or a straight, branched or cyclic alkyl group of 1 to 8 carbon atoms, or $R^{19}$ and $R^{20}$, taken together, may form a ring, with the proviso that each of $R^{19}$ and $R^{20}$ is a straight or branched alkylene group of 1 to 8 carbon atoms when they form a ring. $R^{21}$ is a straight, branched or cyclic alkylene group of 1 to 10 carbon atoms. Letter b and d each are 0 or an integer of 1 to 10, preferably 0 or an integer of 1 to 5, and c is an integer of 1 to 7. A is a (c+1)-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, carbonyl group or fluorine atom. B is —CO—O—, —NHCO—O— or —NHCONH—.

Preferably, A is a di- to tetra-valent straight, branched or cyclic alkylene, alkyltriyl or alkyltetrayl group of 1 to 20 carbon atoms or arylene group of 6 to 30 carbon atoms, which may have an intervening hetero atom and in which the hydrogen atom attached to a carbon atom may be partially replaced by a hydroxyl group, carboxyl group, acyl group or halogen atom. Letter c is preferably an integer of 1 to 3.

As understood from the value of c in formula (5a) or (5b), the crosslinking group is not limited to a divalent one and trivalent to octavalent groups are acceptable. For example, the divalent crosslinking group is exemplified by groups of the following formulas (5a') and (5b'), and the trivalent crosslinking group is exemplified by groups of the following formulas (5a") and (5b").

(5a')

(5b')

-continued

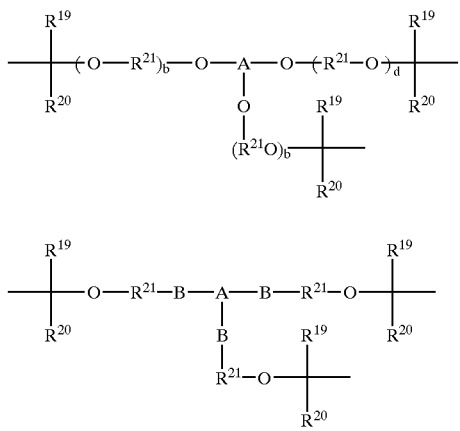

"A" in the crosslinking group is described in more detail. The (c+1)-valent organic groups represented by A include hydrocarbon groups, for example, substituted or unsubstituted alkylene groups having 1 to 50 carbon atoms, especially 1 to 40 carbon atoms, substituted or unsubstituted arylene groups having 6 to 50 carbon atoms, more preferably 6 to 40 carbon atoms, a combination of an alkylene group and an arylene group, and c'-valent groups obtained by eliminating one hydrogen atom attached to a carbon atom from the foregoing groups wherein c' is an integer of 3 to 8; and (c+1)-valent heterocyclic groups, and a combination of such a heterocyclic group with any one of the foregoing hydrocarbon groups. In the alkylene and arylene groups, a hetero atom such as O, NH, N(CH$_3$), S and SO$_2$ may intervene and where substituted, the substituent is a hydroxyl, carboxyl, acyl group or fluorine.

Illustrative examples of A are given below.

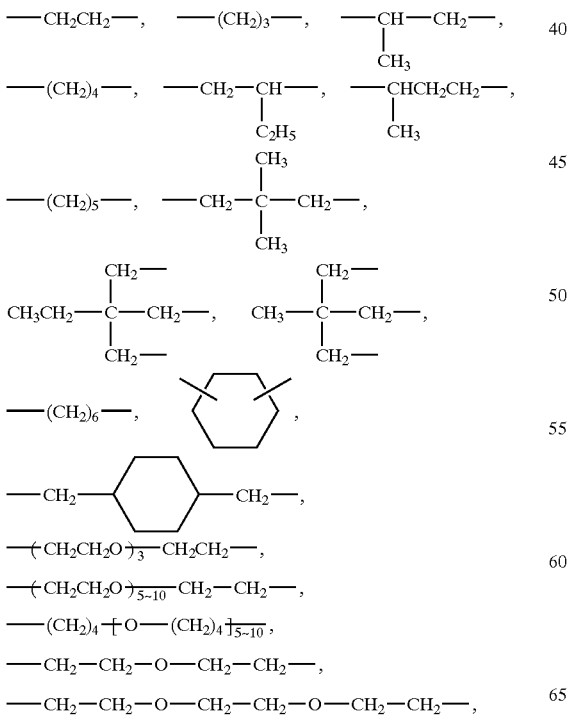

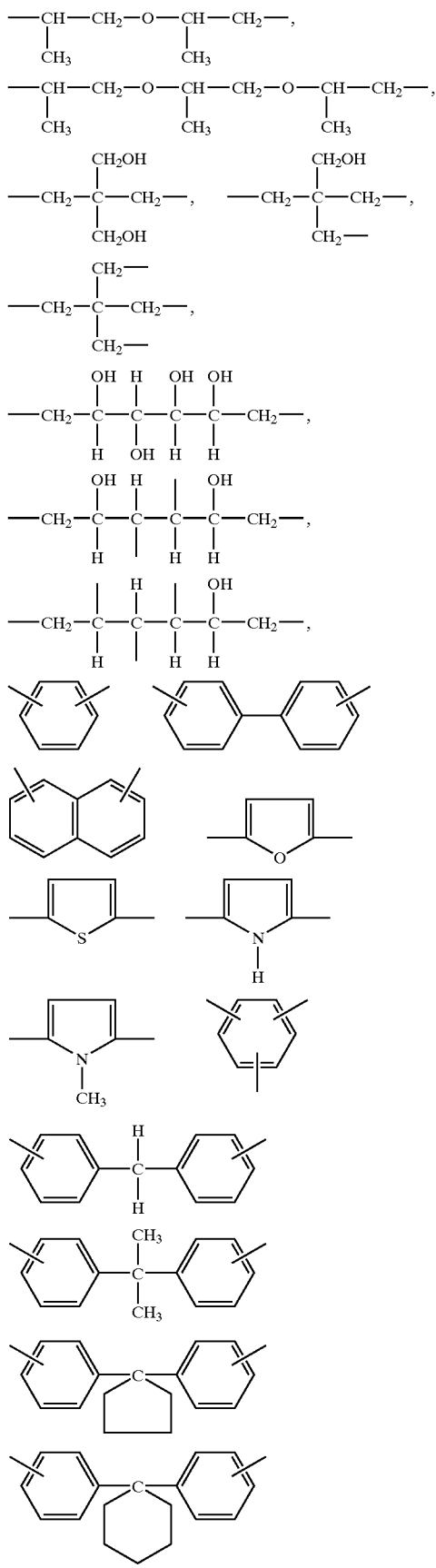

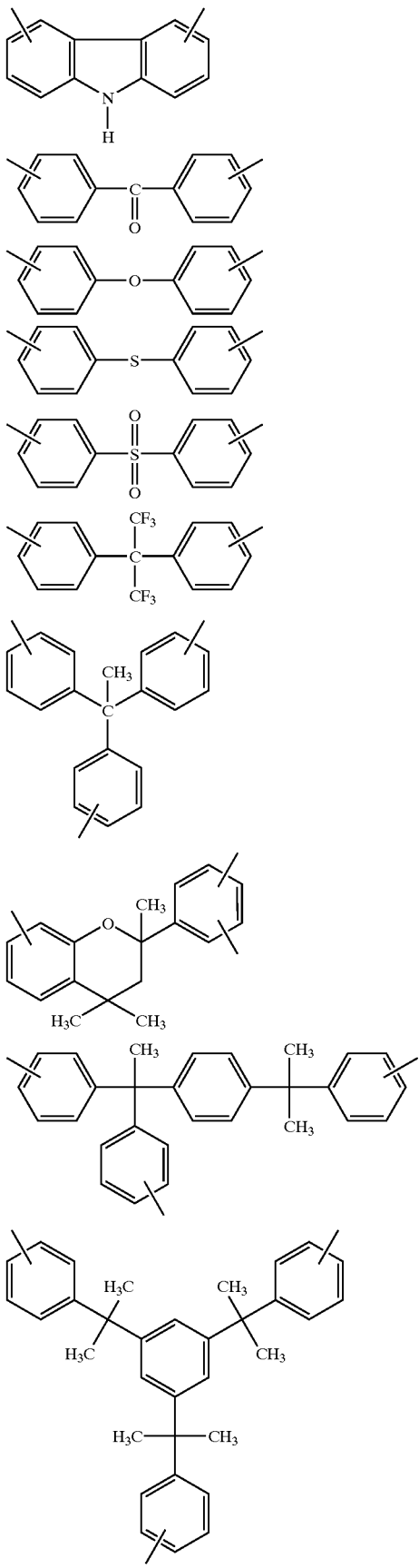
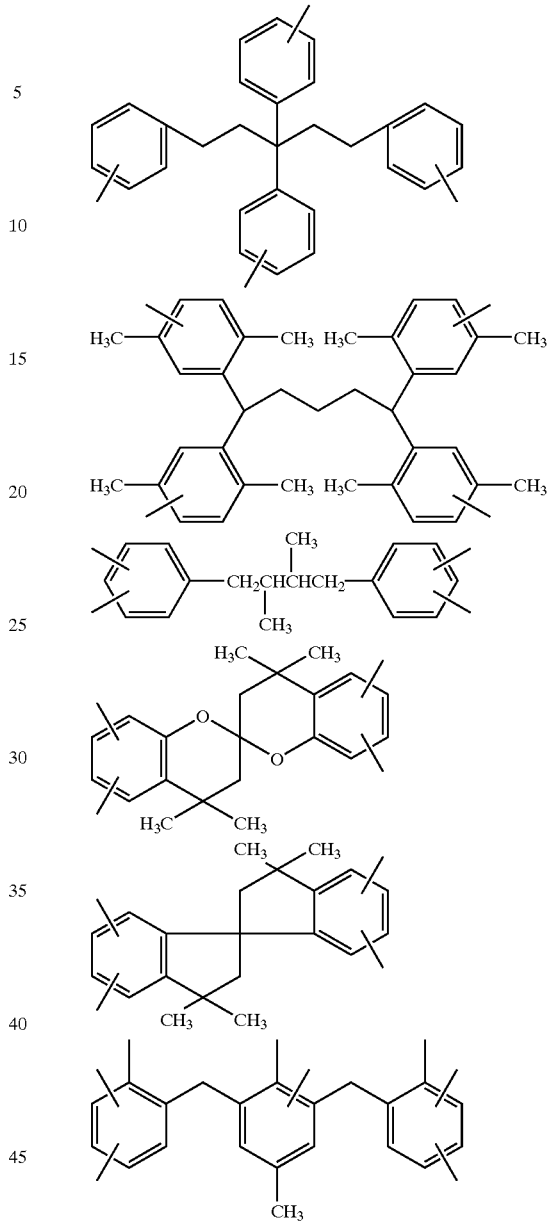

Preferably, in formula (5a), $R^{19}$ is methyl, $R^{20}$ is hydrogen, b is 0, c is 1, and A is ethylene, 1,4-butylene or 1,4-cyclohexylene.

The polymer which is crosslinked between molecules and/or within a molecule with crosslinking groups having C—O—C linkages can be synthesized by reacting a corresponding uncrosslinked polymer with an alkenyl ether in the presence of an acid catalyst in a conventional way.

Where decomposition of other acid labile groups takes place under the acid catalyzed condition, the alkenyl ether is previously reacted with hydrochloric acid or the like to form a halogenated alkyl ether, which is reacted with the uncrosslinked polymer under basic conditions in a conventional way, obtaining the end product.

Illustrative, non-limiting examples of the alkenyl ether include ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, 1,4-divinyloxymethyl cyclohexane, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, and compounds of the formulas (I-1) to (I-31) given below.

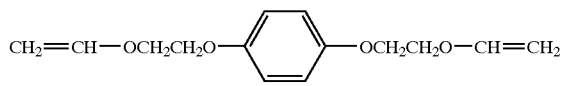
(I-1)

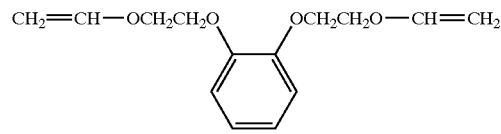
(I-2)

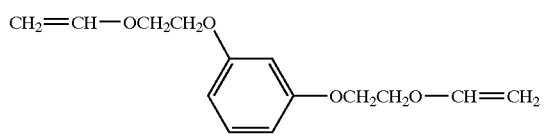
(I-3)

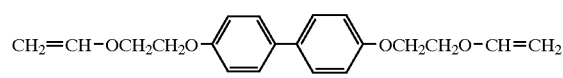
(I-4)

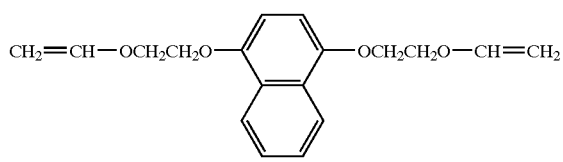
(I-5)

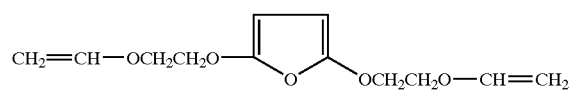
(I-6)

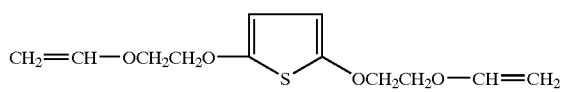
(I-7)

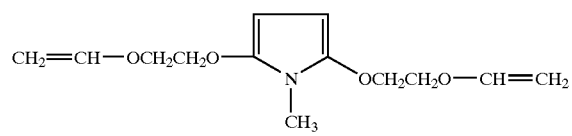
(I-8)

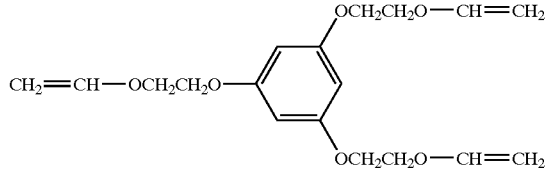
(I-9)

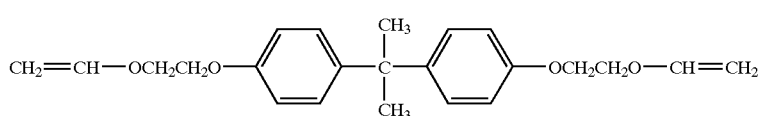
(I-10)

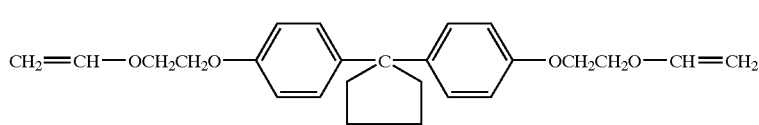
(I-11)

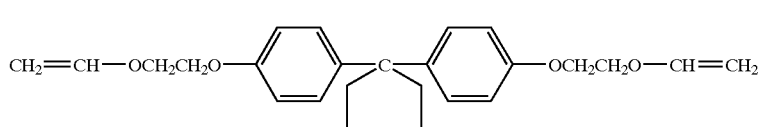
(I-12)

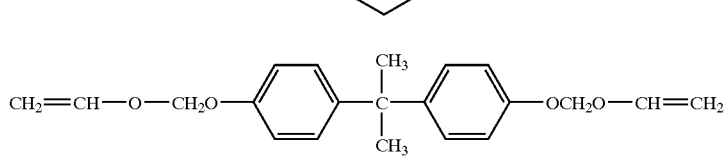
(I-13)

-continued
(I-14)
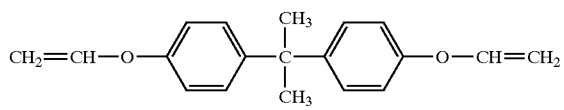
(I-15)
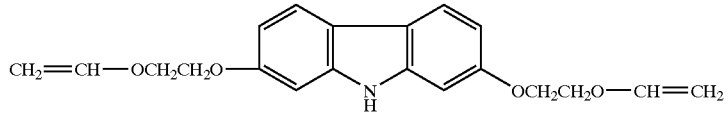
(I-16)
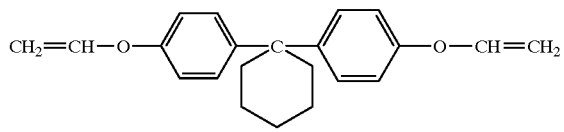
(I-17)
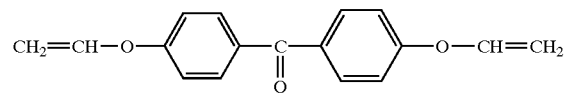
(I-18)
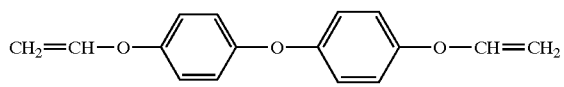
(I-19)
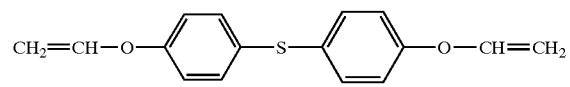
(I-20)
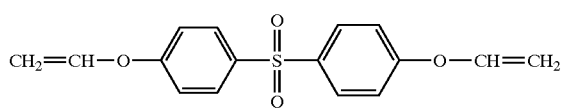
(I-21)
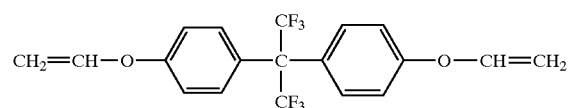
(I-22)
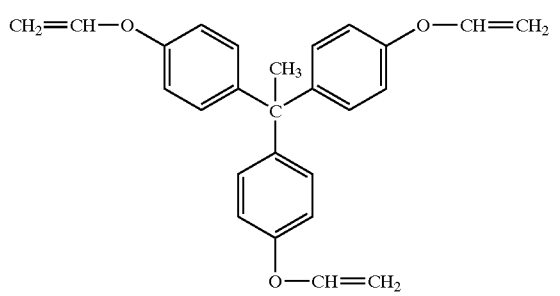
(I-23)
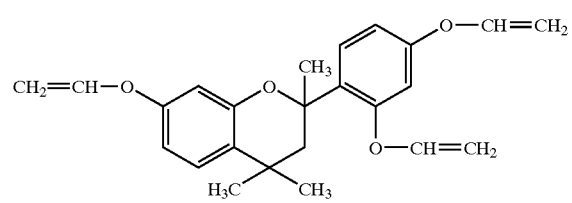
(I-24)
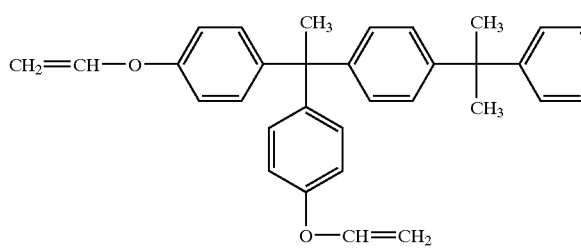
(I-25)
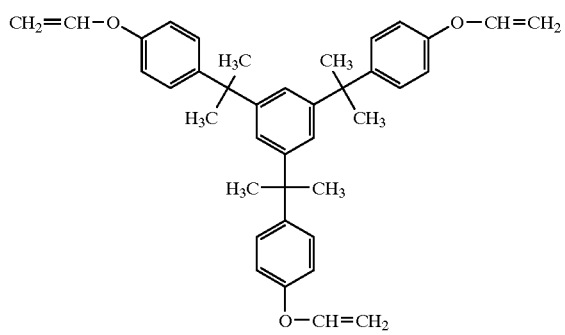
(I-26)
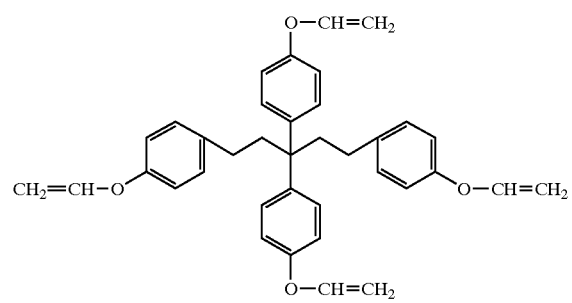

-continued

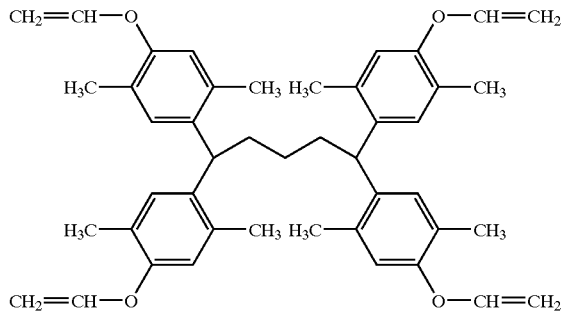
(I-27)

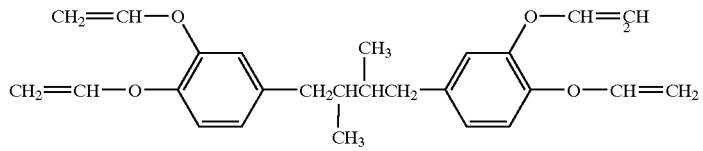
(I-28)

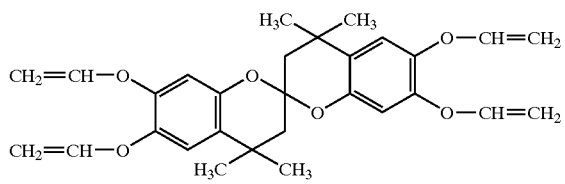
(I-29)

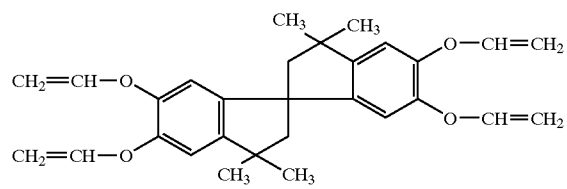
(I-30)

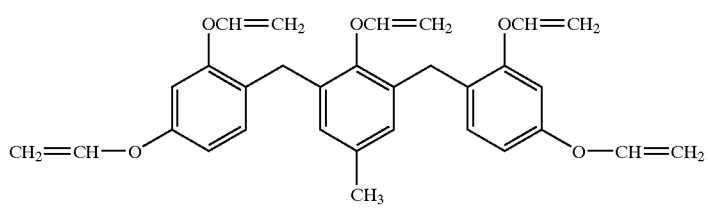
(I-31)

Also included are diethylene vinyl ether terephthalate, diethylene vinyl ether phthalate, diethylene vinyl ether isophthalate, dipropylene vinyl ether phthalate, dipropylene vinyl ether terephthalate, dipropylene vinyl ether isophthalate, diethylene vinyl ether maleate, diethylene vinyl ether fumarate, and diethylene vinyl ether itaconate, and compounds of the formulas (II-1) to (II-11) given below. The alkenyl ether is not limited to the exemplified compounds.

(II-1)

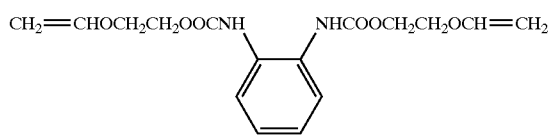
(II-2)

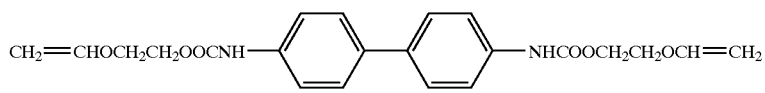
(II-3)

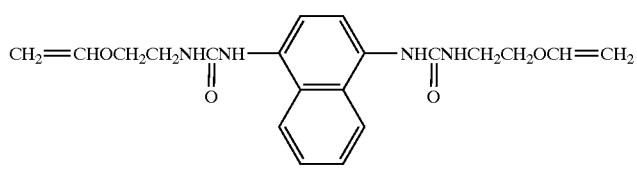
(II-4)

-continued

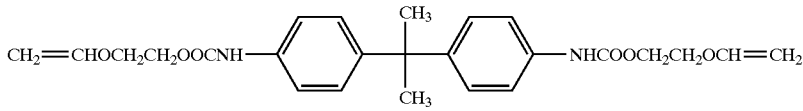
(II-5)

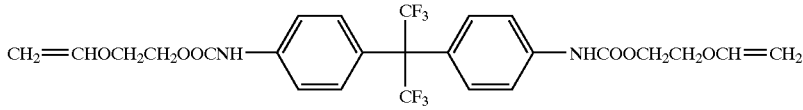
(II-6)

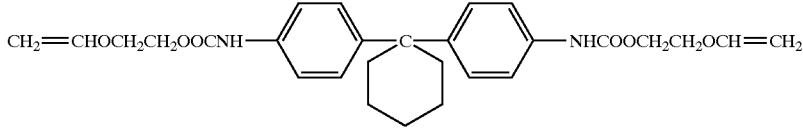
(II-7)

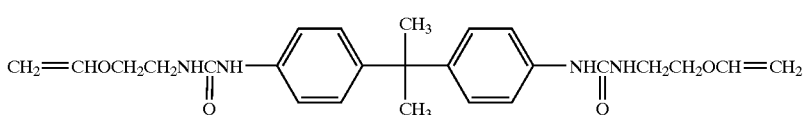
(II-8)

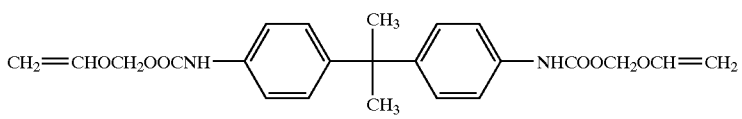
(II-9)

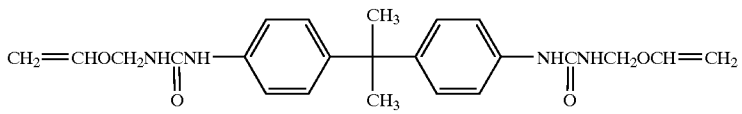
(II-10)

(II-11)

Referring back to formula (1), subscripts m and n are positive numbers, satisfying the range: $0<n/(n+m)<1$ and $0<m/(n+m)<1$, preferably $0.1<n/(n+m)<0.9$ and $0.1<m/(n+m)<0.9$, and more preferably $0.2<n/(n+m)<0.8$ and $0.2<m/(n+m)<0.8$.

In addition to the recurring units of formula (1), the inventive polymer may contain less than 50 mol %, especially less than 40 mol % of recurring units of the formula (6a) or (6b) shown below, or recurring units originating from methacrylic acid derivatives, acrylic acid derivatives, malonic acid derivatives, itaconic acid derivatives, vinyl alcohol derivatives, maleic anhydride derivatives or maleimide derivatives.

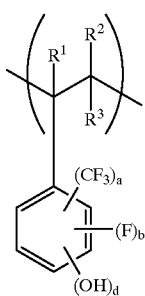
(6a)

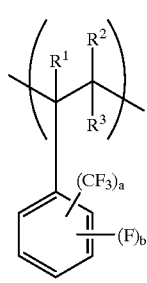
(6b)

In formula (6a) or (6b), $R^1$, $R^2$, $R^3$, a and b are as defined above, and d is a number in the range: $0<d<5$.

The polymer of the invention is generally synthesized by mixing monomers of the following formulae (1a) and (1b) to afford the respective units with a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for polymerization the polymer of the invention are radical polymerization of triggering polymerization with radicals of 2,2'-azobisisobutyronitrile (AIBN) or the like, and ion (anion) polymerization using catalysts such as alkyl lithium.

The polymerization reaction can be effected in a conventional way.

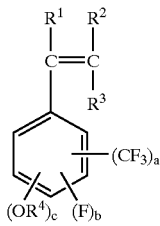
(1a)

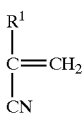
(1b)

Desirably the polymer has a weight average molecular weight of about 2,000 to about 1,000,000, and especially about 3,000 to about 100,000.

The polymer of the invention can be used as a base resin in resist compositions, specifically chemical amplification type resist compositions, and especially chemical amplification type positive working resist compositions.

Resist Composition

In a preferred embodiment, the chemically amplified positive resist composition is defined as comprising (A) the polymer (base resin) defined above, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the photoacid generator, base resin (inventive polymer), dissolution inhibitor, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

Component (C)

Suitable examples of the photoacid generator (C) include onium salts of general formula (7) below, diazomethane derivatives of formula (8), glyoxime derivatives of formula (9), β-ketosulfone derivatives, disulfone derivatives, nitrobenzylsulfonate derivatives, sulfonic acid ester derivatives, and imidoyl sulfonate derivatives.

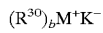 (7)

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

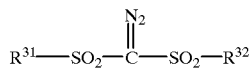 (8)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluoro-butyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

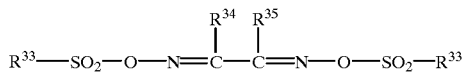 (9)

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups as mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:
onium salts such as diphenyliodonium trifluoromethanesulfonate, (p-tert-butoxyphenyl)

phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)-sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)-diazomethane, bis(p-toluenesulfonyl)diazomethane, bis (xylenesulfonyl)diazomethane, bis(cyclohexylsulfonyl)-diazomethane, bis(cyclopentylsulfonyl)diazomethane, bis (n-butylsulfonyl)diazomethane, bis(isobutylsulfonyl)-diazomethane, bis(sec-butylsulfonyl)diazomethane, bis(n-propylsulfonyl)diazomethane, bis(isopropylsulfonyl)-diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)-diazomethane, 1-cyclohexylsulfonyl-1-(tert-butylsulfonyl)-diazomethane, 1-cyclohexylsulfonyl-1-(tert-amylsulfonyl)-diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris (trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, and tris(p-tert-butoxyphenyl)sulfonium p-toluenesulfonate; diazomethane derivatives such as bis(benzenesulfonyl)diazomethane, bis (p-toluenesulfonyl)diazomethane, bis(cyclohexylsulfonyl) diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight, and especially about 0.5 to 8 parts by weight, per 100 parts by weight of all the base resins. At less than 0.2 part, the amount of acid generated during exposure would be too small and the sensitivity and resolution be poor, whereas the addition of more than 15 parts would lower the transmittance of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (10) and (11) may also be included.

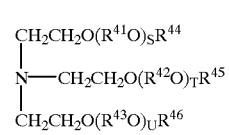

(10)

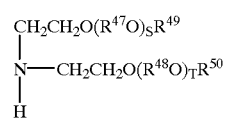

(11)

In the formulas, $R^{41}$, $R^{42}$, $R^{43}$, $R^{47}$ and $R^{48}$ independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have pendant alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (10) and (11) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of all the base resins. At less than 0.01 part, the desired effects of the basic compound would not be apparent, while the use of more than 2 parts would result in too low a sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thimolphthalein. The acid labile substituents are the same as those exemplified as the acid labile groups in the polymer.

Illustrative, non-limiting, examples of the dissolution inhibitors which are useful herein include
bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl) valerate,
tert-butyl 4,4-bis(4'-(2"-tetrahydrofuranyloxy)phenyl) valerate,
tert-butyl 4,4-bis(4'-tert-butoxyphenyl)valerate,
tert-butyl 4,4-bis(4'-tert-butoxycarbonyloxyphenyl)valerate,
tert-butyl 4,4-bis(4'-tert-butoxycarbonylmethyloxyphenyl)- valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

In the resist composition according to the invention, an appropriate amount of the dissolution inhibitor (E) is up to about 20 parts, and especially up to about 15 parts by weight per 100 parts by weight of the solids in the composition. With more than 20 parts of the dissolution inhibitor, the resist composition becomes less heat resistant because of an increased content of monomer components.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 $\mu$m, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation having a wavelength below 300 nm such as deep-UV rays, excimer laser light, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micropattern formation with, in particular, deep-UV rays having a wavelength of 254 to 120 nm, an excimer laser, especially ArF excimer laser (193 nm), $F_2$ excimer laser (157 nm), $Kr_2$ excimer laser (146 nm), KrAr excimer laser (134 nm) or $Ar_2$ excimer laser (121 nm), x-rays, or an electron beam. The desired pattern may not be obtainable outside the upper and lower limits of the above range.

The resist composition comprising the polymer of the invention is sensitive to high-energy radiation, has excellent sensitivity and resolution at a wavelength of less than 200 nm, especially less than 170 nm, and excellent plasma etching resistance. Because these features of the inventive resist composition enable its use particularly as a resist having a low absorption at the exposure wavelength of a $F_2$ excimer laser, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation. The abbreviations used herein are AIBN for 2,2'-azobisisobutyronitrile, GPC for gel permeation chromatography, NMR for nuclear magnetic resonance, Mw for weight average molecular weight, and Mn for number average molecular weight.

Synthesis Example 1

Synthesis of 2,3-difluoro-4-tert-butoxy-α-methylstyrene/methacrylonitrile (1/1) copolymer In a 2-liter flask, 17 g of methacrylonitrile and 56 g of 2,3-difluoro-4-tert-butoxy-α-methylstyrene were dissolved in 560 ml of toluene. The system was fully purged of oxygen, 3 g of the initiator AIBN was added, and the system was heated at 60° C. at which polymerization reaction took place for 24 hours.

The polymer thus obtained was worked up by pouring the reaction mixture into a hexane/ether (3/2) mixture whereupon the polymer precipitated. The polymer was separated and dried. There was obtained 51 g of a white polymer, poly(2,3-difluoro-4-tert-butoxy-α-methylstyrene)-co-polymethacrylonitrile copolymer.

The polymer was found to have a Mw of 16,700 as measured by the light scattering method, and a dispersity (Mw/Mn) of 1.80 as determined from the GPC elution curve. On $^1$H-NMR analysis, the polymer was found to consist of 2,3-difluoro-4-tert-butoxy-α-methylstyrene and methacrylonitrile in a ratio of approximately 1:1.

Synthesis Example 2

Synthesis of 2,6-difluoro-4-tert-butoxy-α-methylstyrene/methacrylonitrile (1/1) copolymer In a 2-liter flask, 17 g of methacrylonitrile and 56 g of 2,6-difluoro-4-tert-butoxy-α-methylstyrene were dissolved in 560 ml of toluene. The system was fully purged of oxygen, 3 g of the initiator AIBN was added, and the system was heated at 60° C. at which polymerization reaction took place for 24 hours.

The polymer thus obtained was worked up by pouring the reaction mixture into a hexane/ether (3/2) mixture whereupon the polymer precipitated. The polymer was separated and dried. There was obtained 50 g of a white polymer, poly(2,6-difluoro-4-tert-butoxy-α-methylstyrene)-co-polymethacrylonitrile copolymer.

The polymer was found to have a Mw of 15,300 as measured by the light scattering method, and a dispersity (Mw/Mn) of 1.67 as determined from the GPC elution curve. On $^1$H-NMR analysis, the polymer was found to consist of 2,6-difluoro-4-tert-butoxy-α-methylstyrene and methacrylonitrile in a ratio of approximately 1:1.

Synthesis Example 3

Synthesis of 2,3-difluoro-4-tert-butoxy-α-methylstyrene/4-trifluoromethylstyrene/methacrylonitrile (0.6/0.4/1) copolymer In a 2-liter flask, 17 g of methacrylonitrile, 34 g of 2,3-difluoro-4-tert-butoxy-α-methylstyrene and 19 g of 4-trifluoromethylstyrene were dissolved in 560 ml of toluene. The system was fully purged of oxygen, 3 g of the initiator AIBN was added, and the system was heated at 60° C. at which polymerization reaction took place for 24 hours.

The polymer thus obtained was worked up by pouring the reaction mixture into a hexane/ether (3/2) mixture whereupon the polymer precipitated. The polymer was separated and dried. There was obtained 55 g of a white polymer, poly(2,3-difluoro-4-tert-butoxy-α-methylstyrene)-co-poly(4-trifluoromethylstyrene)-co-polymethacrylonitrile copolymer.

The polymer was found to have a Mw of 14,700 as measured by the light scattering method, and a dispersity (Mw/Mn) of 1.88 as determined from the GPC elution curve. On $^1$H-NMR analysis, the polymer was found to consist of 2,3-difluoro-4-tert-butoxy-α-methylstyrene, 4-trifluoromethylstyrene and methacrylonitrile in a ratio of approximately 0.6:0.4:1.

Synthesis Example 4

Synthesis of 2,3-difluoro-4-tert-butoxy-α-methylstyrene/2,3,4,5,6-pentafluorostyrene/methacrylonitrile (0.6/0.4/1) copolymer In a 2-liter flask, 17 g of methacrylonitrile, 34 g of 2,3-difluoro-4-tert-butoxy-α-methylstyrene and 30 g of 2,3,4,5,6-pentafluorostyrene were dissolved in 560 ml of toluene. The system was fully purged of oxygen, 3 g of the initiator AIBN was added, and the system was heated at 60° C. at which polymerization reaction took place for 24 hours.

The polymer thus obtained was worked up by pouring the reaction mixture into a hexane/ether (3/2) mixture whereupon the polymer precipitated. The polymer was separated and dried. There was obtained 55 g of a white polymer, poly(2,3-difluoro-4-tert-butoxy-α-methylstyrene)-co-poly(2,3,4,5,6-pentafluorostyrene)-co-polymethacrylonitrile copolymer.

The polymer was found to have a Mw of 13,200 as measured by the light scattering method, and a dispersity (Mw/Mn) of 1.66 as determined from the GPC elution curve. On $^1$H-NMR analysis, the polymer was found to consist of 2,3-difluoro-4-tert-butoxy-α-methylstyrene, 2,3,4,5,6-pentafluorostyrene and methacrylonitrile in a ratio of approximately 0.6:0.4:1.

Evaluation of Polymers

The polymers obtained in Synthesis Examples (SE1 to 4) were determined for transmittance.

A polymer, designated Comparative Polymer 1, was synthesized from a monodisperse polyhydroxystyrene having a molecular weight of 10,000 and a dispersity (Mw/Mn) of 1.10 by substituting tert-butyl groups for 30% of the hydroxyl groups. Comparative Polymer 2 was poly(methyl methacrylate) having a molecular weight of 15,000 and a dispersity of 1.7. Comparative Polymer 3 was a novolac polymer having a meta/para ratio of 40/60, a molecular weight of 9,000 and a dispersity of 2.5.

Polymer transmittance measurement

Each polymer, 1 g, was thoroughly dissolved in 10 g of propylene glycol monomethyl ether acetate (PGMEA), and passed through a 0.2-micron filter, obtaining a polymer solution.

The polymer solution was spin coated onto a $MgF_2$ substrate and baked on a hot plate at 100° C. for 90 seconds, forming a polymer layer of 300 nm thick on the $MgF_2$ substrate. Using a vacuum ultraviolet spectrometer (VUV200S by Nihon Bunko K.K.), the polymer layer was measured for transmittance at 248 nm, 193 nm and 157 nm. The results are shown in Table 1.

TABLE 1

| Polymer | Transmittance (%) | | |
|---|---|---|---|
| | 248 nm | 193 nm | 157 nm |
| SE1 Polymer | 88 | 15 | 30 |
| SE2 Polymer | 88 | 16 | 28 |
| SE3 Polymer | 87 | 18 | 33 |
| SE4 Polymer | 89 | 20 | 31 |
| Comparative Polymer 1 | 85 | 1 | 3 |
| Comparative Polymer 2 | 90 | 70 | 1 |
| Comparative Polymer 3 | 70 | 1 | 6 |

Dry Etching Test

Dry etching tests were carried out by spin coating the above polymer solution on a silicon substrate, baking on a hot plate at 100° C. for 90 seconds to form a polymer layer of 300 nm thick on the silicon substrate, and etching the polymer layer under two sets of conditions. The results are shown in Table 2.

(1) Etching test with $CHF_3/CF_4$ gas

Using a dry etching instrument TE-8500P (Tokyo Electron K.K.), the difference in polymer film thickness before and after etching was determined.

The etching conditions are given below.

| chamber pressure | 40.0 Pa |
|---|---|
| RF power | 1300 W |
| gap | 9 mm |
| $CHF_3$ gas flow rate | 30 ml/min |
| $CF_4$ gas flow rate | 30 ml/min |
| Ar gas flow rate | 100 ml/min |
| time | 60 sec |

(2) Etching test with $Cl_2/BCl_3$ gas

Using a dry etching instrument L-507D-L (Nichiden Anerba K.K.), the difference in polymer film thickness before and after etching was determined.

The etching conditions are given below.

| chamber pressure | 40.0 Pa |
|---|---|
| RF power | 300 W |
| gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| time | 60 sec |

TABLE 2

| Polymer | $CHF_3/CF_4$ gas etching rate (nm/min) | $Cl_2/BCl_3$ gas etching rate (nm/min) |
|---|---|---|
| SE1 Polymer | 92 | 120 |
| SE2 Polymer | 93 | 125 |
| SE3 Polymer | 91 | 106 |
| SE4 Polymer | 98 | 108 |
| Comparative Polymer 1 | 110 | 210 |
| Comparative Polymer 2 | 180 | 350 |
| Comparative Polymer 3 | 90 | 110 |

Using the above polymers, resist compositions were prepared as follows.

Examples and Comparative Example

Resist solutions were prepared by thoroughly dissolving the polymer, photoacid generator (PAG1 or PAG2), basic compound and dissolution inhibitor (DRI1) in the solvent in the amounts shown in Table 3 and passing the solutions through a 0.1-micron PTFE filter.

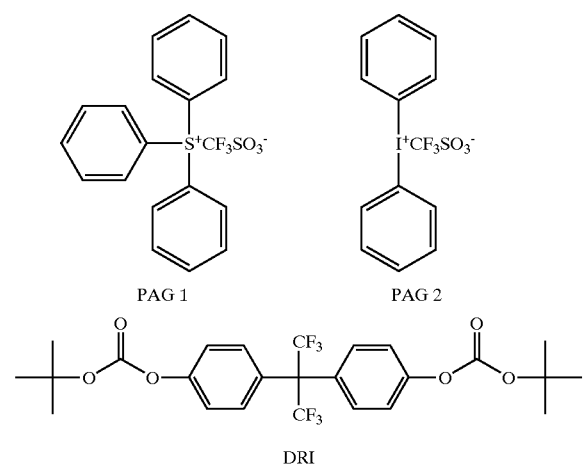

-continued

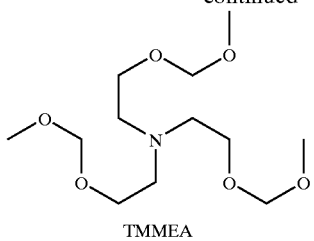

TMMEA

TBA: tributylamine
TEA: triethanolamine
PGMEA: propylene glycol monomethyl ether acetate Note that the PGMEA solvent contained 100 ppm of fluorochemical surfactant FC-430 (Sumitomo-3M Co., Ltd.).

On silicon wafers, DUV-30 (Nissan Chemical Co., Ltd.) was coated to form films of 55 nm thick so that the reflectance to KrF light (248 nm) was reduced below 1%. On the coated substrates, the resist solutions were spin coated, then baked on a hot plate at 100° C. for 90 seconds to give resist films having a thickness of 300 nm.

The resist films were exposed by means of an excimer laser stepper (NSR-S202A, from Nikon Corporation; NA 0.6, σ 0.75, 2/3 annular illumination). Immediately after exposure, the resist films were baked at 110° C. for 90 seconds and then developed for 60 seconds with a 2.38% aqueous solution of tetramethylammonium hydroxide, thereby giving 1:1 line-and-space patterns.

The resulting resist patterns were evaluated as described below. The results are shown in Table 3.

Evaluation:

The exposure dose which provides a 1:1 resolution at the top and bottom of a 0.25-μm line-and-space pattern was the optimum exposure dose (sensitivity Eop). The minimum line width of a line-and-space pattern which was ascertained separate at this dose was the resolution of a test resist.

As is evident from Tables 1 to 3, resist materials using the polymers of the invention have sufficient transparency around the wavelength of $F_2$ excimer laser (157 nm) and satisfy the resolution and sensitivity on excimer laser exposure. The difference in resist film thickness before and after etching is small enough, indicating satisfactory dry etching resistance.

Japanese Patent Application No. 2000-271189 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of the following general formula (1):

(1)

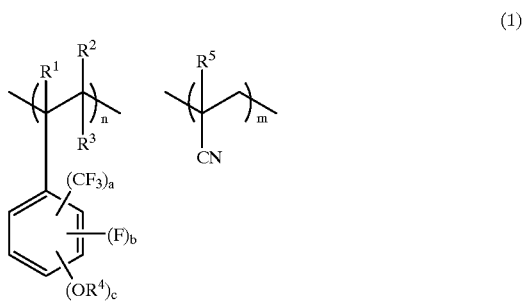

wherein $R^1$, $R^2$, $R^3$ and $R^5$ each are independently hydrogen, fluorine, or a straight, branched or cyclic alkyl or fluorinated alkyl group of 1 to 20 carbon atoms, $R^4$ is an acid labile group, letters a, b and c are numbers satisfying $0 \leq a < 5$, $0 \leq b < 5$, $0 < a+b < 5$ and $0c < 5$, and m and n are positive numbers.

2. A resist composition comprising the polymer of claim 1.

TABLE 3

| Polymer (pbw) | Photoacid generator (pbw) | Basic compound (pbw) | Dissolution inhibitor (pbw) | Solvent (pbw) | Eop (mJ/cm$^2$) | Resolution (μm) |
|---|---|---|---|---|---|---|
| SE1 (100) | PAG1 (2) | TBA (0.1) | — | PGMEA (1000) | 30 | 0.24 |
| SE2 (100) | PAG1 (2) | TBA (0.1) | — | PGMEA (1000) | 20 | 0.22 |
| SE3 (100) | PAG1 (2) | TBA (0.1) | — | PGMEA (1000) | 24 | 0.22 |
| SE4 (100) | PAG1 (2) | TBA (0.1) | — | PGMEA (1000) | 28 | 0.24 |
| SE1 (100) | PAG1 (2) | TEA (0.1) | — | PGMEA (1000) | 32 | 0.24 |
| SE1 (100) | PAG1 (2) | TMMEA (0.1) | — | PGMEA (1000) | 27 | 0.24 |
| SE1 (100) | PAG2 (2) | TBA (0.1) | — | PGMEA (1000) | 22 | 0.24 |
| SE1 (100) | PAG1 (2) | TBA (0.1) | DRI (10) | PGMEA (1000) | 28 | 0.24 |

PGMEA: propylene glycol monomethyl ether acetate

3. A chemically amplified, positive resist composition comprising
  (A) the polymer of claim 1,
  (B) an organic solvent, and
  (C) a photoacid generator.

4. The resist composition of claim 3 further comprising (D) a basic compound.

5. A chemically amplified, positive resist composition according to claim 4, wherein said basic compound (D) is selected from tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, 1-aza-15-crown-5, and combinations thereof.

6. A chemically amplified, positive resist composition according to claim 4, wherein said basic compound (D) is used in an amount of 0.01 to 2 parts per 100 parts by weight of all the base resins.

7. The resist composition of claim 3 further comprising (E) a dissolution inhibitor.

8. A chemically amplified, positive resist composition according to claim 7, wherein said dissolution inhibitor (E) is
bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"tetrahydropyranyloxy)phenyl) valerate,
tert-butyl 4,4-bis(4'-(2"tetrahydrofuranyloxy)phenyl) valerate,
tert-butyl 4,4-bis(4'-tert-butoxyphenyl)valerate,
tert-butyl 4,4-bis(4tert-butoxycarbonyloxyphenyl)valerate,
tert-butyl 4,4-bis(4'-tert-butoxycarbonylmethyloxphenyl) valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, or
1,1,2-tris(4'-(1'-ethoxypropyloxy)phenyl)ethane.

9. A chemically amplified, positive resist composition according to claim 7, wherein said dissolution inhibitor (E) is used in an amount of up to about 20 parts per 100 parts by weight of the solids in the composition.

10. A chemically amplified, positive resist composition according to claim 3, wherein said an organic solvent (B) is diethylene glycol dimethyl ether, 1-ethoxy-2-propanol and ethyl lactate, propylene glycol monomethyl ether acetate, or mixtures thereof.

11. A chemically amplified, positive resist composition according to claim 3, wherein said photoacid generator (C) is triphenylsulfonium trifluoromethanesulfonate, (p-tert-butoxyphenyl)diphenlylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, tris(p-tert-butoxyphenyl)sulfonium p-toluenesulfonate, bis(benzenesulfonyl)diazomethane, bis(p-toluenesulfonyl)diazomethane, bis(cyclohexylsulfonyl)diazomethane, bis(n-butylsulfonyl)-diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis-O-(p-toluenesulfonyl)-α-dimethylglyoxime, bis-O-(n-butanesulfonyl)-α-dimethylglyoxime or combinations thereof.

12. A chemically amplified, positive resist composition according to claim 3, wherein said photoacid generator (C) is added in an amount of 0.2 to 15 parts by weight per 100 parts by weight of all the base resins.

13. A polymer according to claim 1, wherein $R^1$, $R^2$, $R^3$ and $R^5$ are each indpendently methyl, ethyl, propyl, isopropyl, n-butyl, sec-butyl, tert-butyl, cyclopentyl, cyclohexyl, 2-ethylhexyl, n-octyl, trifluoromethyl, 2,2,2-trifluoroethyl, 3,3,3-trifluoropropyl, or 1,1,2,2,3,3,3-heptafluoropropyl.

14. A polymer according to claim 1, wherein $R^4$ is selected from the groups of the following formulas (2) and (3), tertiary alkyl groups with 4 to 40 carbon atoms of the following formula (4), trialkylsilyl groups whose alkyl groups each have 1 to 6 carbon atoms, and oxoalkyl groups of 4 to 20 carbon atoms

(2)

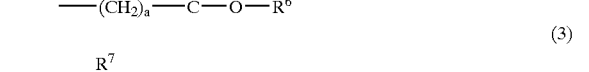

(3)

(4)

wherein
  $R^6$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (4);
  "a" is an integer of 0 to 6;
  $R^7$ and $R^8$ are each independently hydrogen or straight, branched or cyclic alkyl groups of 1 to 18 carbon atoms, and $R^9$ is a monovalent hydrocarbon group of 1 to 18 carbon atoms, and a pair of $R^7$ and $R^8$, a pair of $R^7$ and $R^9$, or a pair of $R^8$ and $R^9$, taken together, may form a ring, wherein each of $R^7$, $R^8$ and $R^9$ is a straight or branched alkylene group of 1 to 18 carbon atoms when forming a ring; and $R^{10}$, $R^{11}$ and $R^{12}$ are each independently monovalent hydrocarbon groups which may contain a heteroatom selected from oxygen, sulfur, nitrogen and fluorine, or a pair of $R^{10}$ and $R^{11}$, a pair of $R^{10}$ and $R^{12}$, or a pair of $R^{11}$ and $R^{12}$, taken together, may form a ring, wherein each of $R^{10}$, $R^{11}$ and $R^{12}$ is a straight or branched alkylene group of 3 to 20 carbon atoms when forming a ring.

15. A polymer according to claim 14, wherein $R^{10}$, $R^{11}$ and $R^{12}$ are independently straight, branched or cyclic alkyl groups of 1 to 20 carbon atoms, which may contain a heteroatom selected from oxygen, sulfur, nitrogen and fluorine.

16. A polymer according to claim 1, wherein $R^4$ a crosslinking group of formula (5a) or (5b):

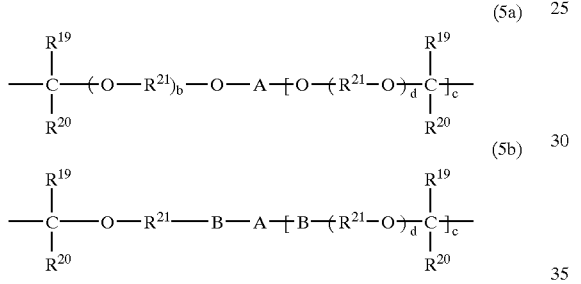

wherein $R^{19}$ and $R^{20}$ each are hydrogen or a straight, branched or cyclic alkyl group of 1 to 8 carbon atoms, or $R^{19}$ and $R^{20}$, taken together, may form a ring, with the proviso that each of $R^{19}$ and $R^{20}$ is a straight or branched alkylene group of 1 to 8 carbon atoms when they form a ring, $R^{21}$ is a straight, branched or cyclic alkylene group of 1 to 10 carbon atoms, b and d each are 0 or an integer of 1 to 10, c is an integer of 1 to 7, A is a (c+1)-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, carbonyl group or fluorine atom, and B is —CO—O—, —NHCO—O— or —NHCONH—.

17. A polymer according to claim 16, wherein $R^4$ a crosslinking group of the following formula (5a), $R^{19}$ is methyl, $R^{20}$ is hydrogen, b is 0, c is 1, and A is ethylene, 1,4-butylene or 1,4-cyclohexylene.

18. A polymer according to claim 1, wherein said polymer contains less than 50 mol % of recurring units of the formula (6a) or (6b) shown below, recurring units originating from methacrylic acid derivatives, recurring units acrylic acid derivatives, recurring units malonic acid derivatives, recurring units itaconic acid derivatives, recurring units vinyl alcohol derivatives, recurring units maleic anhydride derivatives or recurring units maleimide derivatives,

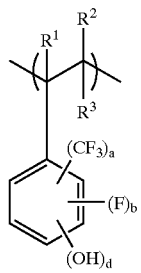

(6a)

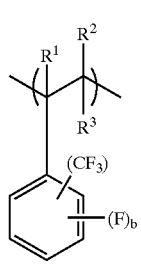

(6b)

wherein d is a number in the range: 0<d<5.

19. A process for forming a resist pattern comprising the steps of:

applying the resist composition of claim 2 onto a substrate to form a coating, heat treating the coating and then exposing it to high-energy radiation having a wavelength of up to 300 nm or an electron beam through a photo mask, and optionally heat treating the exposed coating and developing it with a developer.

20. A polymer comprising recurring units of the formula:

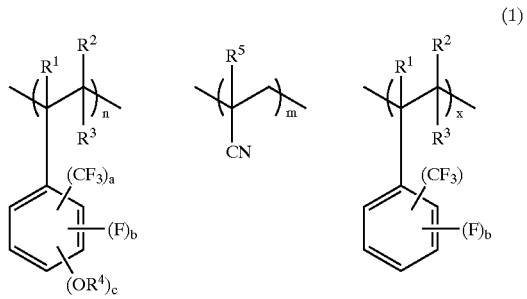

(1)

wherein $R^1$, $R^2$, $R^3$ and $R^5$ each are independently hydrogen, fluorine, or a straight, branched or cyclic alkyl or fluorinated alkyl group of 1 to 20 carbon atoms, $R^4$ is an acid labile group, letters a, b and c are numbers satisfying $0 \leq a<5$, $0 \leq b<5$, $0<a+b<5$ and $0<c<5$, m and n are positive numbers, and the unit X is present and represents less than 50 mol % of the polymer.

21. A chemically amplified, positive resist composition comprising: (A) polymer comprising recurring units of the formula:

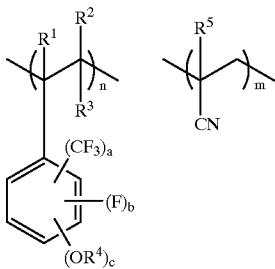

(1)

wherein $R^1$, $R^2$, $R^3$ and $R^5$ each are independently hydrogen, fluorine, or a straight, branched or cyclic alkyl or fluorinated alkyl group of 1 to 20 carbon atoms, $R^4$ is an acid labile group, letters a, b and c are numbers satisfying $0 \leq a < 5$, $0 \leq b < 5$, $0 < a+b < 5$ and $0 < c < 5$, and m and n are positive numbers, (B) an organic solvent,
(C) a photoacid generator, and
(D) a basic compound.

22. A resist composition of claim 21, further comprising (B) a dissolution inhibitor.

23. A process for forming a resist pattern comprising the steps of:

applying the resist composition of claim 21 onto a substrate to form a coating, heat treating the coating and then exposing it to high-energy radiation having a wavelength of up to 300 nm or an electron beam through a photo mask, and optionally heat treating the exposed coating and developing it with a developer.

24. A process for forming a resist pattern comprising the steps of:

applying the resist composition of claim 22 onto a substrate to form a coating, heat treating the coating and then exposing it to high-energy radiation having a wavelength of up to 300 nm or an electron beam through a photo mask, and optionally heat treating the exposed coating and developing it with a developer.

* * * * *